United States Patent

Krug et al.

[11] Patent Number: 5,286,531
[45] Date of Patent: Feb. 15, 1994

[54] METHOD FOR TREATING AN OXIDE COATING

[75] Inventors: Thomas Krug, Rodenbach; Klemens Ruebsam, Jossgrund; Andreas Meier, Pfullingen; Gerhard Steiniger, Ronneburg, all of Fed. Rep. of Germany; Mitsuru Kano, Tokyo, Japan; Noboru Sasaki; Takashi Miyamoto, both of Sugito, Japan; Mamoru Sekiguchi, Kawaguchi, Japan

[73] Assignees: Leybold Aktiengesellschaft, Hanau, Fed. Rep. of Germany; Toppan Printing Company, Ltd., Tokyo, Japan

[21] Appl. No.: 924,318

[22] Filed: Aug. 3, 1992

[30] Foreign Application Priority Data

Feb. 8, 1992 [DE] Fed. Rep. of Germany ....... 4203631

[51] Int. Cl.$^5$ ................................ C23C 16/50
[52] U.S. Cl. .................... 427/536; 427/537; 427/539; 118/719; 118/723 E
[58] Field of Search ............. 118/719, 723 E; 427/536, 537, 539

[56] References Cited

U.S. PATENT DOCUMENTS

| | | | |
|---|---|---|---|
| 4,740,385 | 4/1988 | Feuerstein et al. | 427/124 |
| 4,874,631 | 10/1989 | Jacobson | 118/723 |
| 5,065,697 | 11/1991 | Yoshida | 118/720 |

FOREIGN PATENT DOCUMENTS 0041850 12/1981 European Pat. Off. .

OTHER PUBLICATIONS

Yang, J. Appl. Phys., 68(5), Sep. 1, 1990, pp. 2308–2310.
T. Krug, K. Rübsam: Die neue "gläserne" Lebensmittelverpakung in neue verpackung, Hüthig-Verlag, 1991.
Patent Abstracts of Japan, vol. 6, No. 49, (C-96)(927), Mar. 31, 1982 and JP-A-56 163 262, Dec. 15, 1981.
Patent Abstracts of Japan: 3-068754 A., C-839, Jun. 10, 1991, vol. 15, No. 227.
Patent Abstracts of Japan: 3-017252 A., C-820, Apr. 2, 1991, vol. 15, No. 133.
Patent Abstracts of Japan: 2-250953 A., C-790, Dec. 19, 1990, vol. 14, No. 571.
Patent Abstracts of Japan: 1-255661 A., C-673, Jan. 10, 1990, vol. 14, No. 7.

Primary Examiner—Richard Bueker
Attorney, Agent, or Firm—Felfe & Lynch

[57] ABSTRACT

The invention relates to a method for the aftertreatment of an oxide coating, and specifically an $SiO_x$ coating on a synthetic film. In this aftertreatment the oxide coating is exposed to a plasma whose particles effect positive changes of the oxide coating.

18 Claims, 1 Drawing Sheet

METHOD FOR TREATING AN OXIDE COATING

The invention relates to a method according to the preamble of Patent Claim 1.

Thin coatings are often applied on synthetic material, in particular on clear synthetic material, in order to compensate for negative properties of these synthetic materials or to add new properties.

A negative property of synthetic films is the permeability to gases and water vapor. It does indeed appear as if films of this type are absolutely impermeable, however, it has been found that considerable quantities of molecules can diffuse through them. If such films are used as packaging material for food items, this property represents a significant shortcoming because over time oxygen penetrates into the packaging and flavors or aromas can escape.

It is already known to apply onto synthetic films an additional barrier against the diffusion of $O_2$, $H_2O$ or aromas and flavors (T. Krug, K. Rübsam: "Die neue "gläserne" Lebensmittelverpackung" in "neue verpackung", Hüthig-Verlag, 1991). Such a transparent barrier permeable to microwaves is achieved by vapor deposition of SiO.

A disadvantage of this coating is however its slightly yellowish color due to the absorption of light at wavelengths below about 450 nm. This yellowish tone makes many packaged items appear unappetizing.

The invention is therefore based on the task of treating the coating of a substrate in such a way that it assumes the desired properties.

This task is solved according to the features of Patent Claim 1.

The advantage achieved with the invention comprises in particular that the transmission of the coating of a clear film in the wavelength range of 450 nm and less is increased without the barrier effect of the SiO coating against oxygen, water, and flavors being impaired. It is moreover possible to eliminate with other coatings on films, for example coatings of MgO or Al$_2$O$_3$, the color effects which rest on an oxygen understoichiometry.

An embodiment example of the invention is depicted in the drawing and will be described in greater detail in the following.

BRIEF DESCRIPTION OF THE DRAWINGS

In FIG. 1 is depicted a schematic representation of an arrangement with which a synthetic film already provided with an SiO coating is subsequently treated. In a container 1 which is evacuated via a suction port 2 to approximately $10^{-2}$ to $10^{-3}$ mbar, is disposed a deflection roller 3 which in the area 5 deflects downward a film 4 coming from a feeder roller (not shown) from which area the film is deflected upward again and supplied to a take-up roller (not shown) as outgoing film. Opposite the area 5 a cathode 7 is disposed which is connected with the negative pole of a dc voltage source 8. An electrical feed line 9 from the voltage source 8 to the electrode 7 is guided through an insulation 10 in the container 1. Below the cathode 7 is disposed a grounded darkroom shielding 50 which prevents a plasma from forming between the cathode 7 and the container 1. If the electrode 7 is connected to a negative potential a plasma 11 is formed between the area 5 and the electrode 7. this plasma comprises an oxygen-argon mixture or an hydrogen-argon mixture introduced into the container 1 through an inlet port 12. Instead of a simple cathode 7, a magnetron cathode can also be used.

A thin coating of SiO disposed on the film 4 is influenced by the plasma 11 in such a way that an SiO$_x$ layer is formed wherein x is between 1 and 2, preferably, however, between 1 and 1.5. This effect on the coating and the subsequent change take place through the bombardment of ionized or excited toms and of electrons out of the plasma 11. Hereby oxygen is introduced into the layer which influences its structure. Particularly excited and ionized oxygen atoms can diffuse into the SiO layer.

A MgO and Al$_2$O$_3$ layer could also be provided on the film 4 instead of an SiO$_x$ layer. If an argon-oxygen mixture is introduced through the port 12 into the container 1, this layer could be brightened if it shows color effects due to an understoichiometry.

Figure 1:
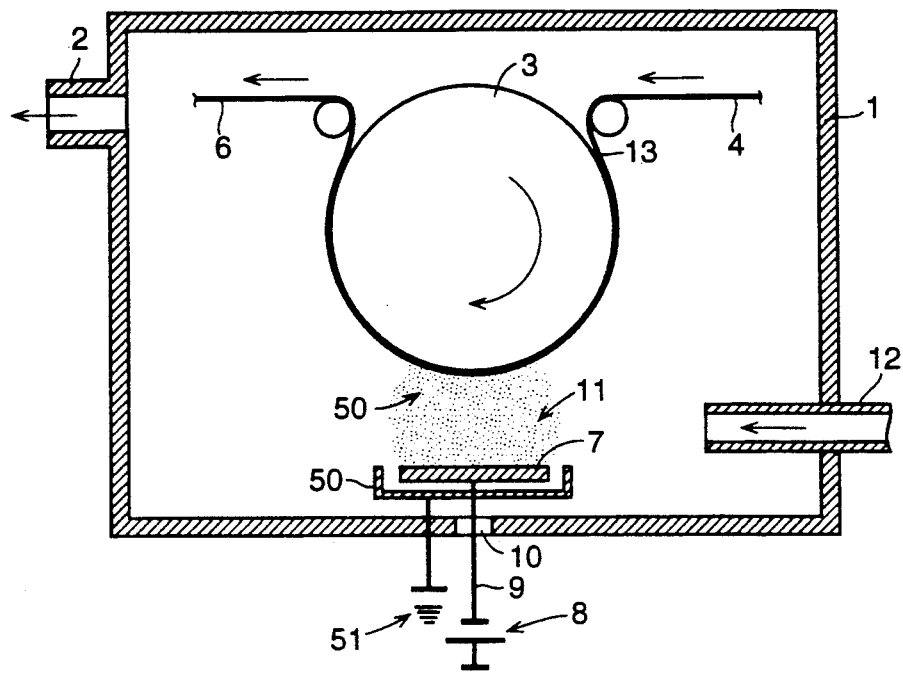
FIG. 1 a schematic representation of a treatment according to the invention of a film coated with metal oxide, FIG. 2 a schematic representation of an arrangement with which a film is coated and subsequently treated by means of a plasma.
Figure 2:
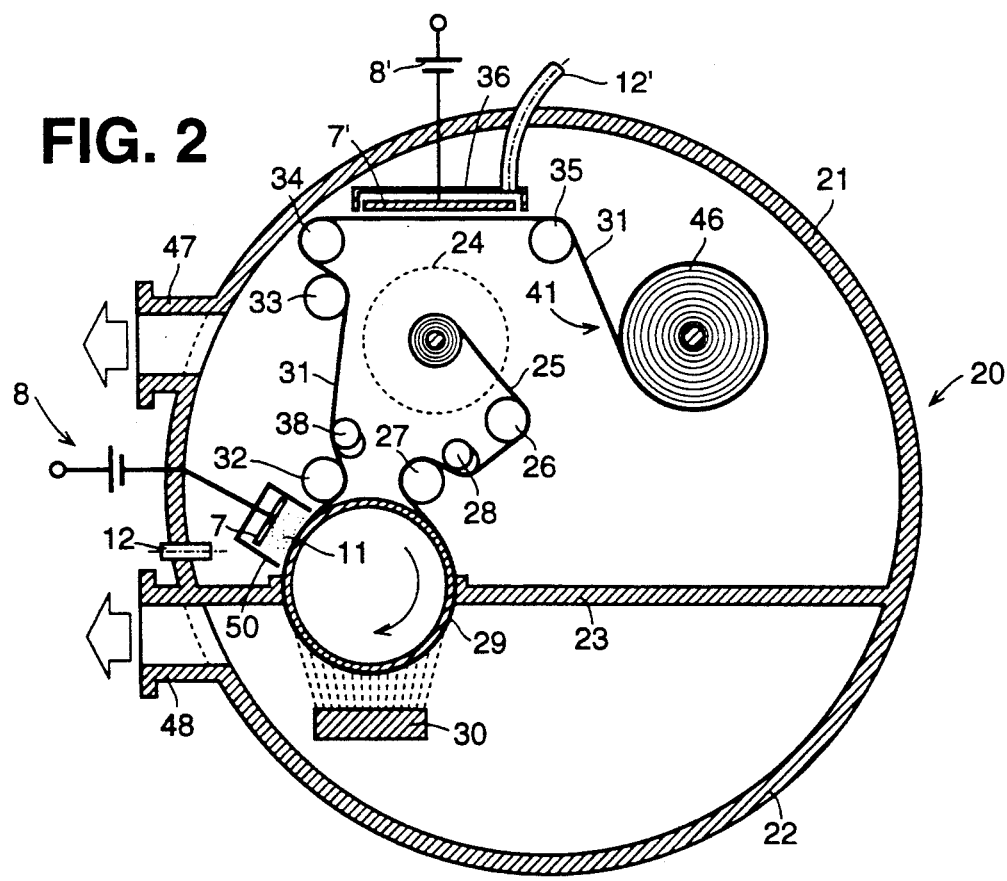

In FIG. 2 is depicted an arrangement with which a film is first coated with SiO$_x$ and subsequently treated with an arrangement according to FIG. 1. A housing 20 is herein divided into two chambers 21, 22 separated by a wall 23. In the upper chamber 21 is disposed a feeder roller 24 from which an uncoated and band-form film 25 is supplied to a coating roller 29 via deflection rollers 26, 27 and a spreader roller 28.

Opposite the coating roller 29 is disposed a crucible 30 in which is contained a coating material, for example SiO. This SiO is vaporized by an oven or by an electron beam and is deposited on the film 25 as a thin layer of SiO$_x$. The necessary amount of oxygen to oxidize Si-O$_{x=1}$ to x between 1.5 to 1.7 is coming from desorbing water vapour from the uncoated film which is thermally cracked by the heat of the coating source 30. Into the interspace between crucible 30 and roller 29, in addition, microwaves can be introduced in order to improve the properties of the coating 31.

After the film 25 has been coated, it moves past a cathode 7 which is disposed in the chamber 21. Between this cathode 7 and the coated film is a plasma 11 through which the coating of the film receives an aftertreatment. In the upper chamber 21 in this case a pressure of approximately $10^{-2}$ mbars obtains, while in the lower chamber 22 a pressure of $10^{-4}$ to $10^{-3}$ mbars obtains. Over deflection rollers 32 to 35 and a spreader roller 38 the treated film 31 is wound onto a take-up roller 46.

The cathode 7 can also be disposed at another site denoted by the reference number 7'. this electrode 7' disposed between the rollers 34 and 35 can be enclosed by their own housing 36 into which gas is introduced. The pressure of $10^{-2}$ mbars in that case only needs to be maintained within the housing 36.

We claim:

1. A method for treating an oxide coating of a plastics film (4, 25) for changing the color effects of said coating based on the stoichiometry of said oxide comprising:
    disposing a glow cathode opposite said oxide coating of said plastics film having said oxide coating;
    moving said plastics film (4, 25) relative to said glow cathode (7, 7'); and
    providing a gas comprising a reactive gas between said glow cathode (7, 7') and said oxide coating of said plastics film (4, 25) having said oxide coating so that said oxide coating is treated by a plasma generated by said glow cathode (7, 7') and comprising said reactive gas to eliminate the color effects which rest on an oxygen understoichiometry.

2. A method as stated in claim 1, in which the oxide coating is an $SiO_x$ layer ($1.5 \leq X \leq 1.7$).

3. A method as stated in claim 1, in which the carrier (4, 25) is a synthetic film.

4. A method as stated in claim 1, which includes adding an inert gas to the reactive gas.

5. A method as stated in claim 1, in which the reactive gas is oxygen.

6. A method as stated in claim 4, in which the reactive gas is $H_2$.

7. A method as stated in claim 4, in which the inert gas is argon.

8. A method as stated in claim 1, in which the reactive gas is under a pressure of $10^{-1}$ to $10^{-3}$ mbar.

9. A method as stated in claim 1, in which said glow cathode (7, 7') is a metallic cathode.

10. A method as stated in claim 1, in which said glow cathode is a magnetron cathode.

11. A method as stated in claim 1, in which moving said plastics film is done by a feeder roller (24) and a take-up roller (46).

12. A method as stated in claim 11, which includes providing between the feeder roller (24) and the take-up roller (46) deflection rollers (32 to 35) over which the film (25) is guided.

13. A method as stated in claim 1, which includes providing an arrangement (29, 30) in which the film (25) is provided with the oxide coating (31).

14. A method as stated in claim 1, which includes providing:
 a) a container (30) in which is contained the material to be vaporized;
 b) a vaporization arrangement for vaporizing the material contained in the container (30);
 c) material (25) to be coated disposed at a distance from the material to be vaporized.

15. A method as stated in claim 14, which includes providing additionally a microwave transmitter which transmits microwaves into the space between the material to be vaporized and material to be coated.

16. A method as stated in claim 1, which includes providing a grounded dark room shielding (50) between a housing (1, 21) in which the plastics film (4, 25) is disposed, and the glow cathode (7).

17. A method as stated in claim 12, which includes disposing the glow cathode (7') between two deflection rollers (34, 35) and opposite the film.

18. A method as stated in claim 17, which includes enclosing the glow cathode (7') by a housing (36) the interior of which has been brought to a given pressure.

* * * * *